(12) United States Patent
Kimman et al.

(10) Patent No.: US 12,546,379 B2
(45) Date of Patent: Feb. 10, 2026

(54) POSITIONING SYSTEM, A LITHOGRAPHIC APPARATUS, A DRIVING FORCE ATTENUATION METHOD, AND A DEVICE MANUFACTURING METHOD

(71) Applicants: ASML Netherlands B.V., Veldhoven (NL); Carl Zeiss SMT GmbH, Oberkochen (DE)

(72) Inventors: Maarten Hartger Kimman, Veldhoven (NL); Hans Butler, Best (NL); Johannes Petrus Martinus Bernardus Vermeulen, Leende (NL); Stefan Troger, Ulm (DE); Michael Erath, Dietenheim (DE); Philipp Gaida, Aalen (DE)

(73) Assignee: ASML NETHERLANDS B.V., Veldhoven (NL)

( * ) Notice: Subject to any disclaimer, the term of this patent is extended or adjusted under 35 U.S.C. 154(b) by 145 days.

(21) Appl. No.: 18/284,580

(22) PCT Filed: Apr. 11, 2022

(86) PCT No.: PCT/EP2022/059632
§ 371 (c)(1),
(2) Date: Sep. 28, 2023

(87) PCT Pub. No.: WO2022/233542
PCT Pub. Date: Nov. 10, 2022

(65) Prior Publication Data
US 2024/0175479 A1    May 30, 2024

(30) Foreign Application Priority Data
May 6, 2021    (EP) ..................... 21172395

(51) Int. Cl.
G03F 7/20    (2006.01)
F16F 15/08   (2006.01)
G03F 7/00    (2006.01)

(52) U.S. Cl.
CPC .......... F16F 15/08 (2013.01); G03F 7/70825 (2013.01); G03F 7/709 (2013.01)

(58) Field of Classification Search
CPC ...... F16F 15/08; F16F 2222/08; F16F 7/1028; F16F 7/108; G03F 7/70825; G03F 7/709
See application file for complete search history.

(56) References Cited

U.S. PATENT DOCUMENTS

| | | |
|---|---|---|
| 6,020,964 A | 2/2000 | Loopstra et al. |
| 6,952,253 B2 | 10/2005 | Lof et al. |

(Continued)

FOREIGN PATENT DOCUMENTS

| | | |
|---|---|---|
| CN | 103547967 | 1/2014 |
| DE | 102019131987 | 1/2020 |

(Continued)

OTHER PUBLICATIONS

International Search Report and Written Opinion issued in corresponding PCT Patent Application No. PCT/EP2022/059632, dated Aug. 4, 2022.

(Continued)

*Primary Examiner* — Mesfin T Asfaw
(74) *Attorney, Agent, or Firm* — Pillsbury Winthrop Shaw Pittman, LLP

(57) ABSTRACT

A positioning system for moving or positioning a moveable object, the system including: a dynamic support system including a reaction mass, a first support, a first spring system to support the reaction mass from the first support, a second support, a second spring system to support the first support from the second support, and a damping system to (Continued)

provide damping to the dynamic support system; and an actuator for generating a driving force between the moveable object and the reaction mass for moving or position the object, wherein a first eigenfrequency and a second eigenfrequency of the dynamic support system are substantially the same.

20 Claims, 3 Drawing Sheets

(56) References Cited

U.S. PATENT DOCUMENTS

| | | |
|---|---|---|
| 9,304,404 B2 | 4/2016 | Fischer et al. |
| 11,029,612 B2 | 6/2021 | Kimman et al. |
| 2003/0197914 A1 | 10/2003 | Cox et al. |
| 2007/0058173 A1 | 3/2007 | Holzapfel |
| 2008/0237947 A1 | 10/2008 | Warmerdam et al. |
| 2012/0105819 A1 | 5/2012 | Butler et al. |
| 2012/0154774 A1* | 6/2012 | Van Der Wijst .... G03F 7/70141 355/53 |
| 2014/0043596 A1* | 2/2014 | Fischer ............... G03F 7/70825 355/71 |
| 2016/0109814 A1 | 4/2016 | Westerhof et al. |
| 2020/0124991 A1 | 4/2020 | Butler |

FOREIGN PATENT DOCUMENTS

| | | |
|---|---|---|
| TW | 201839520 | 11/2018 |
| WO | 2021/023464 | 2/2021 |

OTHER PUBLICATIONS

Office Action issued in corresponding Taiwanese Patent Application No. 111116336 dated Jun. 8, 2023.

* cited by examiner

POSITIONING SYSTEM, A LITHOGRAPHIC APPARATUS, A DRIVING FORCE ATTENUATION METHOD, AND A DEVICE MANUFACTURING METHOD

CROSS-REFERENCE TO RELATED APPLICATIONS

This application is the U.S. national phase entry of PCT Patent Application No. PCT/EP2022/059632 which was filed on Apr. 11, 2022, which claims priority of European Patent Application No. 21172395.2 which was filed on May 6, 2021, and which is incorporated herein in their entirety by reference.

FIELD

The present invention relates to a positioning system. The present invention also relates to a lithographic apparatus comprising such a positioning system. The present invention further relates to a method for attenuating transmission of driving forces between a moveable object and a dynamic support system, and a method for manufacturing a device using a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Lithographic apparatus usually include one or more positioning systems to position an object such as a support for a patterning device, a substrate support or an optical element of a projection system or illumination system.

Positioning systems typically include a dynamic support system and an actuator for generating a driving force between the moveable object and the dynamic support system to move or position the object. The ratio of the forces transmitted by the dynamic support system over the driving force is defined as the actuator force transmissibility. When the ratio is too large, it may negatively affect the position accuracy of the positioning system especially for higher frequencies thereby limiting the achievable control band width.

SUMMARY

Considering the above, it is an object of the invention to provide a positioning system with an improved, i.e. reduced, actuator force transmissibility.

According to an embodiment of the invention, there is provided a positioning system for moving or positioning a moveable object, comprising:
  a dynamic support system comprising:
    a reaction mass,
    a first support,
    a first spring system to support the reaction mass from the first support,
    a second support,
    a second spring system to support the first support from the second support, and
    a damping system to provide damping to the dynamic support system,
  an actuator for generating a driving force between the moveable object and the reaction mass for moving or position the object,
wherein a first eigenfrequency and a second eigenfrequency of the dynamic support system in a direction are substantially the same.

According to another embodiment of the invention, there is provided a lithographic apparatus comprising a positioning system according to the invention.

According to a further embodiment of the invention, there is provided a method for attenuating transmission of driving forces applied between a moveable object and a reaction mass of a dynamic support system by configuring the dynamic support system as a multiple-spring-mass-damper system having a first eigenfrequency and a second eigenfrequency in a direction that are substantially the same.

According to yet another embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
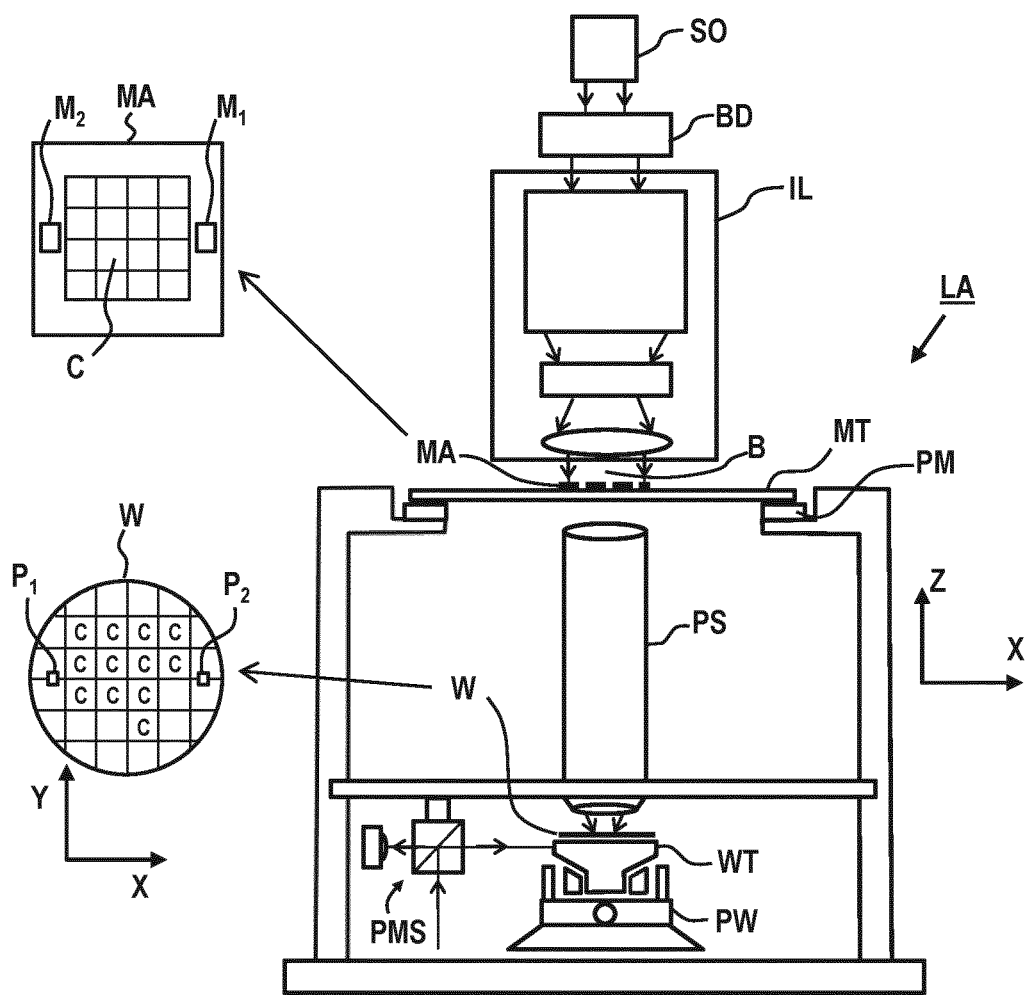
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
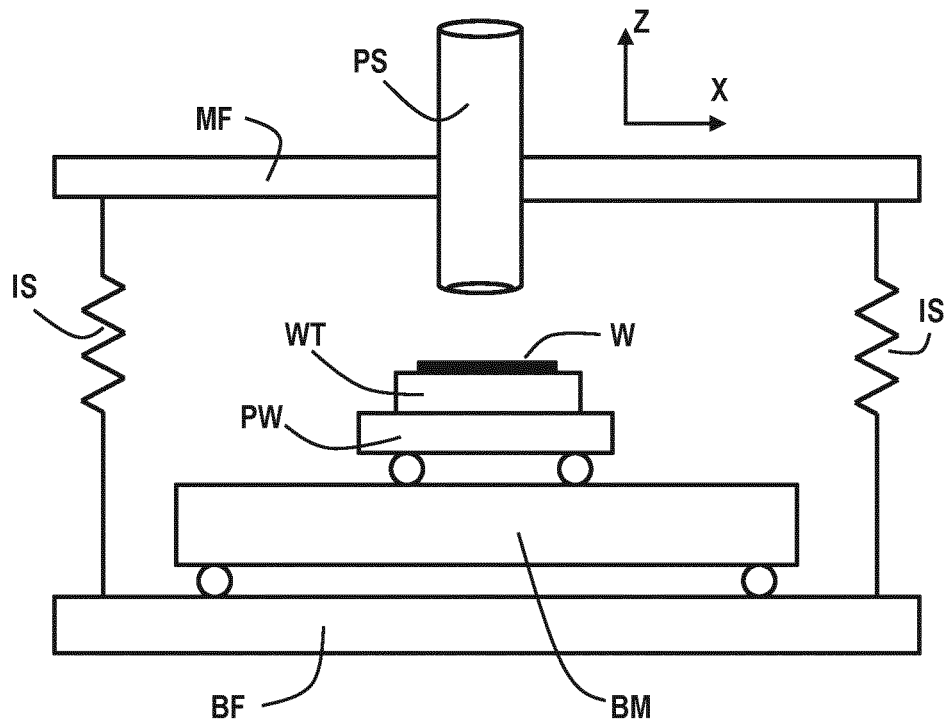
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
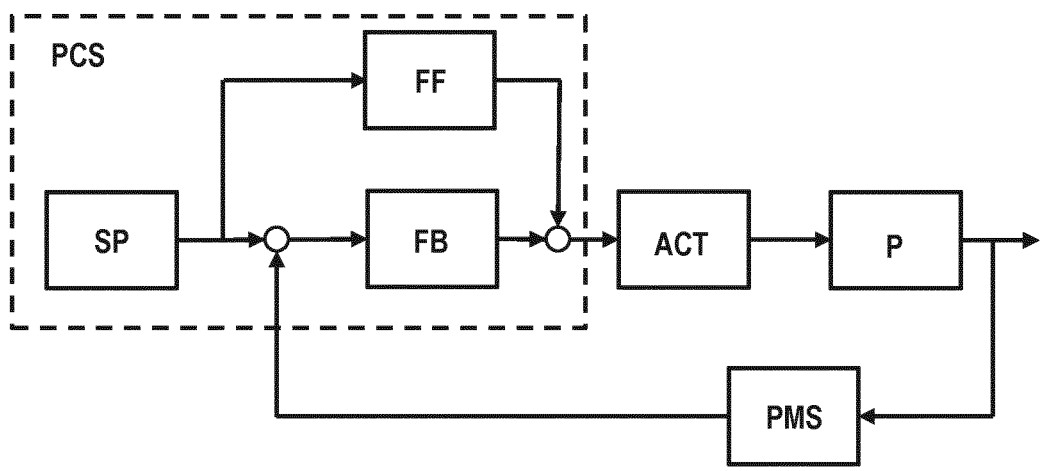
FIG. 3 schematically depicts a position control system as part of a positioning system according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
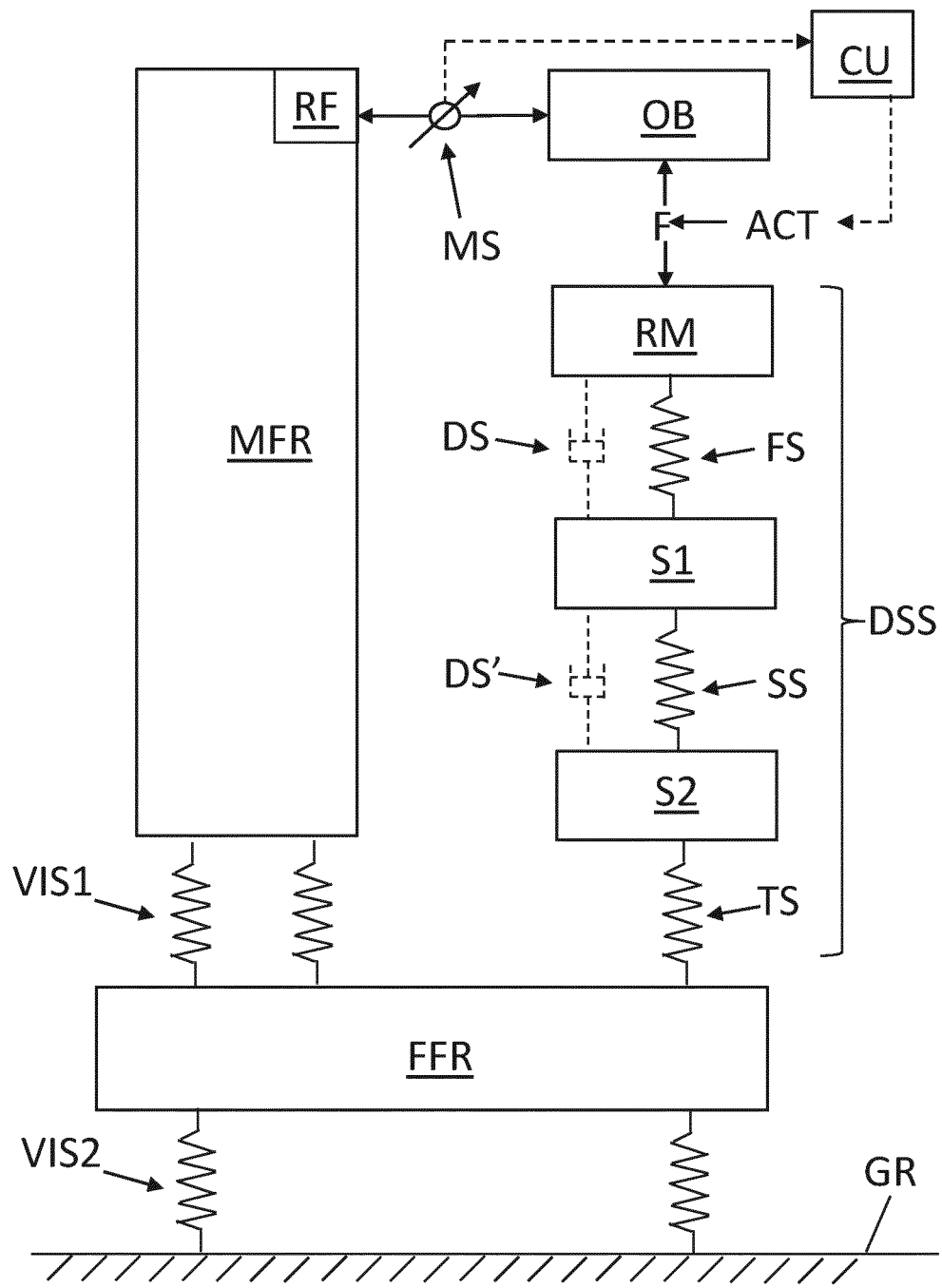
FIG. 4 schematically depicts a part of the lithographic apparatus with a positioning system according to another embodiment of the invention.

FIG. 4 schematically depicts a part of a lithographic apparatus with a positioning system according to another embodiment of the invention. The lithographic apparatus comprises a force frame FFR, alternatively referred to as base frame, and a measurement frame MFR connected to each other via first vibration isolation system VIS1. In this embodiment, the measurement frame MFR is supported by the force frame FFR via the first vibration isolation system VIS1 and the force frame FFR in turn is supported by the ground GR via a second vibration isolation system VIS2. This configuration may be referred to as a series configuration in which the measurement frame MFR is supported by the ground via the force frame FFR. A parallel configuration in which the measurement frame MFR and the force frame FFR are supported by the ground GR via respective vibration isolation systems is also envisaged.

The lithographic apparatus comprises a moveable object OB to be moved and/or positioned to allow the lithographic apparatus to function. Hence, the object OB may be a substrate support WT, a mask support MT, or a component of the projection system PS, e.g. a mirror or lens element, as shown for instance in FIG. 1.

The lithographic apparatus further comprises a positioning system for moving or positioning the object OB. The positioning system comprises a dynamic support system DSS including a reaction mass RM, a first support S1, a first spring system FS, a second support S2, and a second spring system SS. The reaction mass RM is supported by the first support S1 via the first spring system FS. The first support S1 is supported by the second support S2 via the second spring system SS. The second support S2, and thus the dynamic support system DSS, is supported by the force frame FFR via a third spring system TS. The third spring system TS is representative for the connection of the dynamic support system DSS to the force frame FFR, which may be a relatively stiff connection.

The positioning system further comprises an actuator ACT for generating a driving force F between the moveable object OB and the reaction mass RM. The driving force F is transmitted by the dynamic support system DSS to the force frame FFR. The ratio of the force applied to the force frame FFR over the driving force F is defined as the actuator force transmissibility. The actuator ACT may be a contactless actuator, e.g. a Lorentz actuator or a voice-coil actuator.

The positioning system also comprises a measurement system MS to measure a position of the object OB relative to a reference, in this embodiment a reference RF on the measurement frame MFR.

A relatively high actuator force transmissibility may affect the measurement frame MFR and thus the measurement of the position of the object OB. The positioning system further comprises a control unit CU to drive the actuator ACT based on an output of the measurement system MS. Hence, when the measurement of the position is negatively affected by the actuator force transmissibility, the control unit CU is not able to achieve a certain level of position accuracy.

To reduce the actuator force transmissibility and thus increase the position accuracy performance, for instance by obtaining a higher control bandwidth, a first eigenfrequency and a second eigenfrequency of the dynamic support system DSS are substantially the same. This can for instance be obtained by configuring the dynamic support system DSS such that the first eigenfrequency is determined by the first spring system FS and the mass supported thereby and such that the second eigenfrequency is determined by the second spring system SS and the mass supported thereby. Additionally, a spring stiffness defined by the first spring system FS, a spring stiffness defined by the second spring system, and the masses of the reaction mass RM, and first and second supports S1, S2 are chosen such that the first eigenfrequency and the second eigenfrequency are substantially the same. Preferably, the first and second eigenfrequency are equal or almost equal (within 5%), but substantially the same also includes a larger difference (5-20%) between the first and second eigenfrequency as long as there is significant interaction between the two modes corresponding to the first and second eigenfrequencies. In other words, the dynamic support system is configured as a multiple-mass-spring-damper system having a first eigenfrequency and a second eigenfrequency that are substantially the same.

The positioning system yet also comprises a damping system to provide damping to the dynamic support system DSS. In a first embodiment, a damper DS is arranged between the reaction mass RM and the first support S1, possibly as part of the first spring system FS. In a second embodiment, a damper DS' is arranged between the first support S1 and the second support S2. Both alternatives have been depicted in dashed lines in FIG. 4. A third embodiment involves a combination of the first and second embodiment.

The substantially the same first and second eigenfrequencies including the damping system results in the dynamic support system DSS to act like a tuned-mass damper without the use of a separate tuned-mass damper attached to the reaction mass as is currently done in the prior art to reduce the actuator force transmissibility. An advantage thereof may be that the dynamic support system requires less space or that the available space can be used more efficiently or to optimize the functionality of the positioning system.

Another advantage when the damping system is in the force path from reaction mass RM to force frame FFR is that the damping system is able to highly attenuate peaks in the actuator force transmissibility thereby allowing to dampen the higher order dynamics.

The damping system may include a visco-elastic damper. For instance, the damper DS and/or the damper DS' may be a visco-elastic damper.

The damping system may alternatively or additionally include a tuned-mass damper attached to the reaction mass RM, the first support S1 and/or the second support S2.

Although the above examples have been described in relation to a single actuator providing a driving force in a particular direction, the invention may be applied for attenuating reaction forces in other directions as well and/or attenuate driving forces in other directions as well, e.g. when multiple actuators are used to move or position the object in more degrees of freedom.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A positioning system for moving or positioning a moveable object, the system comprising:
    a dynamic support system comprising:
        a reaction mass,
        a first support,
        a first spring system to support the reaction mass from the first support,
        a second support,
        a second spring system to support the first support from the second support, and
        a damping system to provide damping to the dynamic support system; and
    an actuator configured to generate a driving force between the moveable object and the reaction mass for moving or positioning the object,
    wherein a first eigenfrequency and a second eigenfrequency of the dynamic support system in a direction are substantially the same.

2. The positioning system according to claim 1, wherein the damping system is arranged between the reaction mass and the first support.

3. The positioning system according to claim 1, wherein the damping system is arranged between the first support and the second support.

4. The positioning system according to claim 1, wherein the actuator is a contactless actuator.

5. The positioning system according to claim 1, wherein the damping system comprises a visco-elastic damper.

6. The positioning system according to claim 1, wherein the damping system comprises a tuned-mass damper attached to the reaction mass, the first support and/or the second support.

7. The positioning system according to claim 1, wherein the moveable object is a mirror.

8. The positioning system according to claim 1, further comprising a measurement system to measure a position of the moveable object relative to a reference, and a control unit to control the actuator based on an output of the measurement system.

9. A lithographic apparatus comprising the positioning system according to claim 1.

10. The lithographic apparatus according to claim 9, further comprising:
    an illumination system configured to condition a radiation beam;
    a support constructed to support a patterning device, the patterning device being capable of imparting the radiation with a pattern in its cross-section to form a patterned radiation beam;
    a substrate table constructed to hold a substrate; and
    a projection system configured to project the patterned radiation beam onto a target portion of the substrate,
    wherein the moveable object is a component of the projection system.

11. The lithographic apparatus according to claim 9, further comprising a force frame and a measurement frame connected to each other via a vibration isolation system, wherein the second support is supported by the force frame.

12. The lithographic apparatus according to claim 11, further comprising a measurement system to measure a position of the moveable object relative to a reference, and a control unit to control the actuator based on an output of the measurement system, wherein the reference is arranged on the measurement frame.

13. A device manufacturing method wherein use is made of the lithographic apparatus according to claim 9.

14. A method for attenuating transmission of driving forces applied between a moveable object and a reaction mass of a dynamic support system by configuring the dynamic support system as a multiple-mass-spring-damper system having a first eigenfrequency and a second eigenfrequency in a direction that are substantially the same.

15. The method according to claim 14, wherein the dynamic support system comprises
- a first support,
- a first spring system to support the reaction mass from the first support,
- a second support,
- a second spring system to support the first support from the second support, and
- a damping system to provide damping to the dynamic support system.

16. The method according to claim 15, wherein the damping system is arranged between the reaction mass and the first support.

17. The method according to claim 15, wherein the damping system is arranged between the first support and the second support.

18. The method according to claim 15, wherein the damping system comprises a visco-elastic damper.

19. The method according to claim 15, wherein the damping system comprises a tuned-mass damper attached to the reaction mass, the first support and/or the second support.

20. The method according to claim 14, wherein the moveable object is a mirror.

* * * * *